US011128317B2

(12) United States Patent
Ma et al.

(10) Patent No.: US 11,128,317 B2
(45) Date of Patent: Sep. 21, 2021

(54) METHOD FOR TRANSMITTING ADDITIONAL INFORMATION BY USING LINEAR BLOCK CODES

(71) Applicant: SUN YAT SEN UNIVERSITY, Guangzhou (CN)

(72) Inventors: Xiao Ma, Guangzhou (CN); Suihua Cai, Guangzhou (CN)

(73) Assignee: SUN YAT SEN UNIVERSITY, Guangzhou (CN)

( * ) Notice: Subject to any disclaimer, the term of this patent is extended or adjusted under 35 U.S.C. 154(b) by 0 days.

(21) Appl. No.: 16/909,790

(22) Filed: Jun. 23, 2020

(65) Prior Publication Data
US 2020/0412383 A1   Dec. 31, 2020

(30) Foreign Application Priority Data
Jun. 25, 2019   (CN) .......................... 201910553130.0

(51) Int. Cl.
*H03M 13/15* (2006.01)
*H03M 13/03* (2006.01)
(Continued)

(52) U.S. Cl.
CPC ......... *H03M 13/15* (2013.01); *H03M 13/033* (2013.01); *H03M 13/618* (2013.01); *H04L 1/0057* (2013.01)

(58) Field of Classification Search
CPC .. H03M 13/15; H03M 13/033; H03M 13/618; H04L 1/0057
See application file for complete search history.

(56) References Cited

U.S. PATENT DOCUMENTS 8,341,487 B2 * 12/2012 Blanksby ............. H03M 13/116
714/752
9,312,986 B2 * 4/2016 Hatefi ................... H04L 1/0048
(Continued)

FOREIGN PATENT DOCUMENTS

CN        1855731 A    11/2006
CN      101217355 A     7/2008
(Continued)

OTHER PUBLICATIONS

Chang et al., Advanced Information of Parity Bits for Decoding Short Linear Block Codes Using the A* Algorithm, IEEE Transactions on Communications, vol. 61, No. 4, dated Apr. 4, 2013, pp. 1201-1211.
(Continued)

*Primary Examiner* — Justin R Knapp
(74) *Attorney, Agent, or Firm* — Loza & Loza, LLP; Michael F. Fedrick (57) ABSTRACT

The invention discloses a method for transmitting additional information using linear block codes, which comprises the following steps: when encoding: a linear block code C with a code length of n and an information bit length of k is used as a payload code, to embed an additional information sequence v of length m by superposition coding and resulting into a codeword c of length n. When decoding, firstly decode the additional information according to the received sequence y: select an additional information sequence with the largest characteristic metric function value as the decode output. Then perform payload information sequence decoding: remove the interference of superposition sequence ŝ from the received sequence y, and then use the basic linear block code C decoder to decode. The present invention can transmit a small amount of additional information at a low frame error rate while causing a negligible effect on payload (Continued)

information decoding without additionally increasing transmission energy and bandwidth overhead.

11 Claims, 4 Drawing Sheets

(51) Int. Cl.
*H03M 13/00* (2006.01)
*H04L 1/00* (2006.01)

(56) References Cited

U.S. PATENT DOCUMENTS

| | | |
|---|---|---|
| 2009/0158129 A1 | 6/2009 | Myung et al. |
| 2017/0324427 A1 | 11/2017 | Myung et al. |
| 2018/0183909 A1 | 6/2018 | Cariou et al. |

FOREIGN PATENT DOCUMENTS

| | | |
|---|---|---|
| CN | 101277144 A | 10/2008 |
| CN | 102571254 A | 7/2012 |
| CN | 107508659 A | 12/2017 |

OTHER PUBLICATIONS

Li, Qiong, Abstract of "LDPC, Based Supersosition Coding for Two-user Interference Channels," Master's Thesis from Xidian University in China (May 26, 2017).

\* cited by examiner

METHOD FOR TRANSMITTING ADDITIONAL INFORMATION BY USING LINEAR BLOCK CODES

TECHNICAL FIELD

The invention belongs to the field of digital communication and digital storage, and particularly relates to a method for transmitting additional information by using linear block codes.

TECHNICAL BACKGROUND

In order to perform data scheduling and transmission efficiently, in addition to transmitting data information in a communication system, control information must also be transmitted. For the transmission of data information, we focus on the transmission rate, which is required to approach the channel capacity. However, for the transmission of control information, which comprises line signalling information, routing information, etc. and is usually short, it requires high reliability. In order to ensure a higher reliability of control messages, existing schemes use coding schemes with a lower code rate to independently transmit the control information. Therefore, it takes extra energy and bandwidth to transmit this information. Existing research mainly focuses on the ACK/NACK information fed back by the receiving section in the Hybrid Automatic Repeat reQuest (HARQ) system, and realizes the additional transmission of 1 bit of information by selecting different constellations or different coding schemes.

SUMMARY OF THE INVENTION

The main purpose of the present invention is to overcome the shortcomings and deficiencies of the prior art, to provide a method for transmitting additional information using linear block codes, and to embed shorter additional information into basic linear block codes without additional energy consumption and bandwidth.

In order to achieve the above objectives, the present invention adopts the following technical solutions:

This invention provides a method for transmitting additional information using linear block codes, characterized in that, comprises the following steps:

(1) using a linear block code C with a code length of n and an information bit length of k as a payload code, to superposition code an additional information sequence $v=(v_0, v_1, \ldots, v_{m-1})$ of length m into a codeword $c=(c_0, c_1, \ldots, c_{n-1})$ of length n, the encode method is specifically:

(1.1) first encode a payload information sequence u of length k into a linear block code word $w=(w_0, w_1, \ldots, w_{n-1})=C(u)$;

(1.2) input an additional information sequence v of length m into a sequence selector R, and output a sequence $s=(s_0, s_1, \ldots, s_{n-1})=R(v)$ of length n;

(1.3) Superimpose the sequence s with the linear block code word w to obtain the transmission codeword c;

(2) decoding the additional information sequence, comprising or consisting of specifically:

for each possible input additional information sequence $v^{(i)}$, $(0 \le i \le 2^m-1)$, calculate the corresponding superposition sequence $s^{(i)}=R(v^{(i)})=(s_0^{(i)}, s_1^{(i)}, \ldots, s_{n-1}^{(i)})$; according to a characteristic metric function $\mu^{(i)}=f_C(y, s^{(i)})$ related to the basic linear block code C, select an additional information sequence $\hat{v}$ as an output, where $\hat{v}=(\hat{v}_0, \hat{v}_1, \ldots, \hat{v}_{m-1})$ such that:

$$\hat{v} = \arg\max_{v} f_C(y, R(v))$$

(3) decoding the payload information sequence, comprising or consisting of specifically the following steps:
remove an interference of superposition sequence e from a received sequence y, and obtain a corresponding received $\hat{s}=(\hat{s}_0, \hat{s}_1, \ldots, \hat{s}_{n-1})=R(\hat{v})$ sequence $\tilde{y}$ of the basic linear block code related to the payload information;
decode $\tilde{y}$ using a decoder of the basic linear block code C and output $\hat{u}$ of the basic information sequence.

As a preferred embodiment, in the step (1), the linear block code C with a code length of n and an information bit length of k is an arbitrary type of linear block code encoder;
in the step (1.2), the sequence selector R refers to an arbitrary type of encoder whose input information length is m and output length is n;
in the step (1.3), the superposition coding refers to outputting the j th component $c_j = s_j \oplus w_j$ of the sequence c of length n, where $s_j$ and $w_j$ are the j th component of s and w respectively, $0 \le j \le n-1$, and the addition operation "$\oplus$" follows a finite group addition.

As a preferred embodiment, the characteristic metric function $\mu^{(i)}=f_C(y, s^{(i)})$ is a real-value function related to the linear block code C with input of a received sequence y and a sequence $s^{(i)}$, and represents a likelihood measure of the received sequence y related the coset $s^{(i)} \oplus C$.

As a preferred embodiment, the characteristic metric function $f_C$ uses the following calculation method:
calculate a hard decision sequence r from the received sequence y, obtain the sequence $\hat{w}^{(i)}$ by removing an interference of the sequence $s^{(i)}$ from r, then calculate the Hamming weight $W^{(i)}$ of the syndrome of the linear block code with respect to $\hat{w}^{(i)}$, and finally use $n-k-W^{(i)}$ as the output of the function $f_C$;
the hard decision sequence r is expressed as $r=(r_0, r_1, \ldots, r_{n-1})$, and each component in r is calculated according to the following method:

$$r_j = \begin{cases} 0, & P(y_j | c_j = 0) \ge P(y_j | c_j = 1) \\ 1, & P(y_j | c_j = 0) < P(y_j | c_j = 1) \end{cases}, 0 \le j \le n-1$$

where:
$P(y_j|c_j)$ represents the channel transition probability with respect to input $c_j$ and output $y_j$;
remove the interference of the sequence $s^{(i)}$ from the hard decision sequence r to obtain the sequence $\hat{w}^{(i)}$, which means that each component in the $\hat{w}^{(i)}=(\hat{w}_0^{(i)}, \hat{w}_1^{(i)}, \ldots, \hat{w}_{n-1}^{(i)})$ is calculated as follows:
$\hat{w}_j^{(i)} = r_j - s_j^{(i)}$, $0 \le j \le n-1$ wherein the subtraction operation "−" is based on the finite group subtraction operation.

As a preferred embodiment, the method for calculating the Hamming weight $W^{(i)}$ of the syndrome of the linear block code is:

$W^{(i)} = W_H(\hat{w}^{(i)} \cdot H^T)$, where H is a check matrix of the linear block code C, $H^T$ is the transpose of the matrix H, the multiplication "·" is about the matrix multiplication in the binary domain, $W_H(\bullet)$ is the Hamming weight function, and output the number of non-zero elements in a sequence of arguments.

As a preferred embodiment, wherein the characteristic metric function $f_C$ uses the following calculation method:
calculate a log-likelihood ratio sequence z from the received sequence y, obtain a sequence $\hat{z}^{(i)}$ by removing the interference of the sequence $s^{(i)}$ from z, then calculate the likelihood function $\eta^{(i)}$ of $\hat{z}^{(i)}$ related to the linear block code, and finally use $\eta^{(i)}$ as the output of the function $f_C$;

the sequence z is represented as $z=(z_0, z_1, \ldots, z_{n-1})$, and each component in z is calculated as follows:

$$z_j = \log\frac{P(y_j \mid c_j = 0)}{P(y_j \mid c_j = 1)}, 0 \le j \le n-1;$$

remove the interference of the sequence $s^{(i)}$ from the sequence z to get the sequence $\hat{z}^{(i)}$, which means that each component in $\hat{z}^{(i)} = (\hat{z}_0^{(i)}, \hat{z}_1^{(i)}, \ldots, \hat{z}_{n-1}^{(i)})$ is calculated as follows:

$$\hat{z}_j^{(i)} = z_j \times (-1)^{s_j^{(i)}}, 0 \le j \le n-1.$$

As a preferred embodiment, the calculation of the likelihood function $\eta^{(i)}$ of the linear block code comprises the following methods:

$$\eta^{(i)} = 2\sum_{p=0}^{m-1} \tanh^{-1}\left(\prod_{q \in H_p} \tanh\left(\frac{1}{2}\hat{z}_q^{(i)}\right)\right),$$

where m is the number of rows in the check matrix H of the linear block code C, and $H_P$ is the index set of the nonzero element in the pth row of H.

As a preferred embodiment, the calculation of the likelihood function $\eta^{(i)}$ of the linear block code comprises the following methods: input $\hat{z}^{(i)}$ to a decoder D of the linear block code C, output the decoding sequence as $\hat{c}^{(i)} = (\hat{c}_0^{(i)}, \hat{c}_1^{(i)}, \ldots, \hat{c}_{n-1}^{(i)})$, and then calculate $s^{(i)} \oplus \hat{c}^{(i)}$ as a log-likelihood function of a transmission sequence:

$$\eta^{(i)} = \sum_{j=0}^{n-1} \log P(y_j \mid s_j^{(i)} \oplus \hat{c}_j^{(i)}),$$

where the linear block code C of the decoder D is an arbitrary type of soft input decoder.

As a preferred embodiment, in the step (3.1), the interference of the superposition coding $\hat{s} = R(\hat{v})$ is removed from the received sequence y, and the corresponding received sequence $\tilde{y}$ of the linear block code C related to the payload information is obtained, which refers to calculating soft information of the j th component $\tilde{y}_j$ of $\tilde{y}$ with:

$$P(\tilde{y}_j \mid w_j) = P(y_j \mid c_j = w_j \oplus \hat{s}_j),$$

where $\hat{s}_j$ is the j th component of $\hat{s}$, where $0 \le j \le n-1$.

As a preferred embodiment, in the step (3.2), the basic linear block code decoder C refers to an arbitrary type of linear block code decoder.

Compared with the prior art, the present invention has the following advantages and beneficial effects:

In the present invention, the payload information sequence is encoded using the linear code as the basic code, and the additional information is encoded by the sequence selector and superposition coded on the basic linear block code. This enables the transmission of additional information sequences without generating additional transmission energy and bandwidth overhead. When decoding the additional information, since the additional information sequence has fewer bits, it can be decoded by traversal searching, which has higher reliability. By removing the influence of the superposition coding of the additional information sequence and then decoding the basic information sequence with linear block codes, when the signal-to-noise is relatively high, the effect of additional bit transmission on the decoding performance of the basic linear group is negligible.

The present method allows extra bits of information to be transmitted using superposition coding, which requires neither extra transmission energy nor extra bandwidth. This method can be used to provide reliable transmissions for 5G/B5G and IoT (Internet of Things) services such as autonomous vehicles, sensing networks, and remote surgery. For example, this method can be used in collaborative communication among the UAVs (Unmanned Aerial Vehicles) in their sensing networks. In this case, UAV identity information can be transmitted as additional information along with sensing data (i.e., the payload information), and the identity information can be read without decoding the entire data block of a transmission. The complexity of processing the transmitted information can thereby be reduced.

A system which uses this method can consist of modules, namely a payload encoder, a superposition (additional information) encoder, an additional information decoder, and a payload decoder. The payload encoder and superposition encoder can be present as software, firmware, or hardware in a system for transmitting digital information, which can be over a wired connection, a wireless connection, or a combination of these. The additional information decoder and payload decoder can be present as software, firmware, or hardware in a system for receiving digital information, which can be over a wired connection, a wireless connection, or a combination of these.

The technical solutions of the present invention will be further described in detail below through the accompanying drawings and embodiments.

DETAILED DESCRIPTION

Definitions

The term "payload information" refers to a portion of a digital information transmission that comprises data.

The term "additional information" refers to a portion of a digital information transmission that consists of metadata relating to the payload information in the transmission.

The term "data" refers to digital information which represents sensor measurements, communications in human or machine language (in visual, audible, and other form that can be sensed by humans or machines), or information resulting from processing by a processor. Data can include metadata as defined herein.

The term "metadata" refers to digital information that describes or provides further information about data, in particular data of the payload information in a transmission. Metadata can be external descriptive metadata, i.e. information about particular data in the payload information, such as the location of such particular data. Alternatively, metadata can be internal descriptive metadata, i.e. self-contained information which relates to the payload information.

The term "comprise" and variations of the term, such as "comprising" and "comprises," are not intended to exclude other additives, components, integers or steps. The terms "a," "an," and "the" and similar referents used herein are to be construed to cover both the singular and the plural unless their usage in context indicates otherwise.

The present invention will be described in further detail below with reference to examples and drawings, but the embodiments of the present invention are not limited thereto.

Example 1

Figure 1:
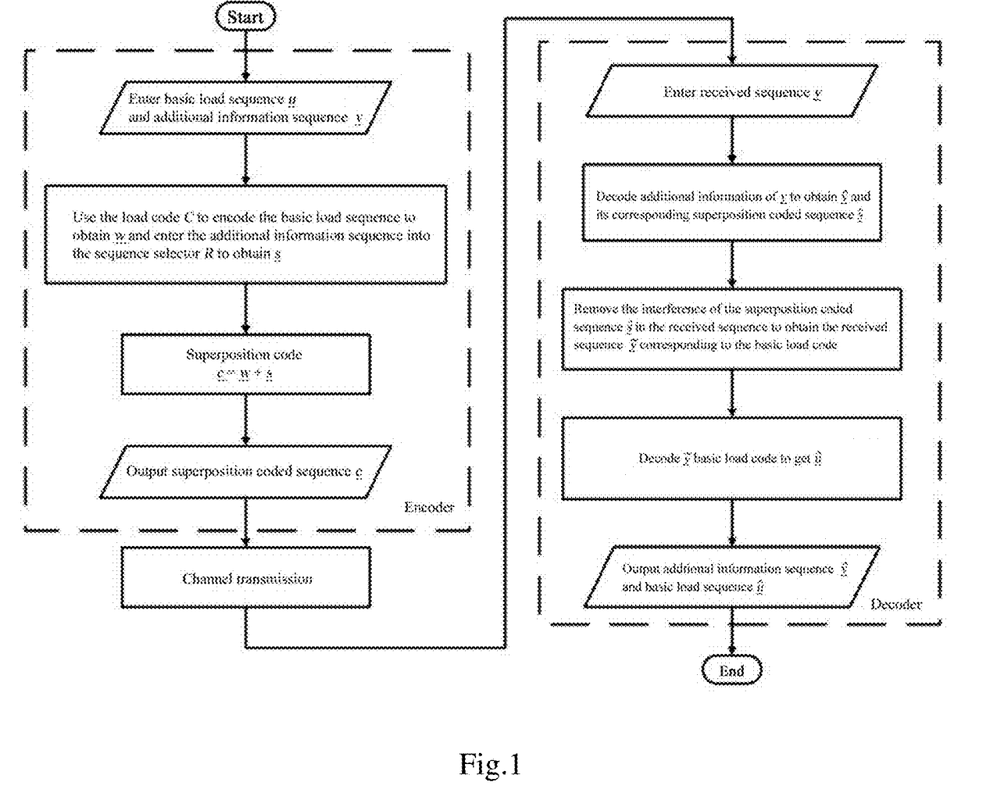
FIG. 1 is a flowchart of the method of the present invention.

As shown in FIG. 1, this embodiment uses method for transmitting additional information using linear block codes, characterized in that, comprises the following steps:

(1) based on a linear block code C with a code length of n and an information bit length of k as a payload code, superposition code an additional information sequence $v=(v_0, v_1, \ldots, v_{m-1})$ of length m into a codeword $c=(c_0, c_1, \ldots, c_{n-1})$ of length n, the encoding method is specifically:

(1.1) first encode a payload information sequence u of length k into a linear block code word $w=(w_0, w_1, \ldots, w_{n-1})=C(u)$;

(1.2) input an additional information sequence v of length m into a sequence selector R, and output a sequence $s=(s_0, s_1, \ldots, s_{n-1})=R(v)$ of length n;

(1.3) Superimpose the sequence s with the linear block code word w to obtain the transmission codeword c;

(2) decoding the additional information sequence, comprising or consisting of specifically:

for each possible input additional information sequence $v^{(i)}$, ($0 \le i \le 2^m - 1$), calculate the corresponding superposition sequence $s^{(i)} = R(v^{(i)}) = (s_0^{(i)}, s_1^{(i)}, \ldots, s_{n-1}^{(i)})$;

according to a characteristic metric function $\mu^{(i)} = f_C(y, s^{(i)})$ related to the basic linear block code C, select an additional information sequence $\hat{v}$ as an output, where $\hat{v} = (\hat{v}_0, \hat{v}_1, \ldots, \hat{v}_{m-1})$ such that:

$$\hat{v} = \operatorname*{argmax}_{v} f_C(y, R(v))$$

The characteristic metric function $\mu^{(i)} = f_C(y, s^{(i)})$ is a real-value function related to the linear block code C with input of a received sequence y and a sequence $s^{(i)}$ represents a likelihood measure of the received sequence y related the coset $s^{(i)} \oplus C$.

(3) decoding the payload information sequence, comprising or consisting of specifically the following steps:

remove an interference of superposition sequence $\hat{s} = (\hat{s}_0, \hat{s}_1, \ldots, \hat{s}_{n-1}) = R(\hat{v})$ from a received sequence y, and obtain a corresponding received sequence $\tilde{y}$ of the basic linear block code related to the payload information;

decode $\tilde{y}$ using a decoder of the basic linear block code C and output $\hat{u}$ of the basic information sequence.

Figure 2:
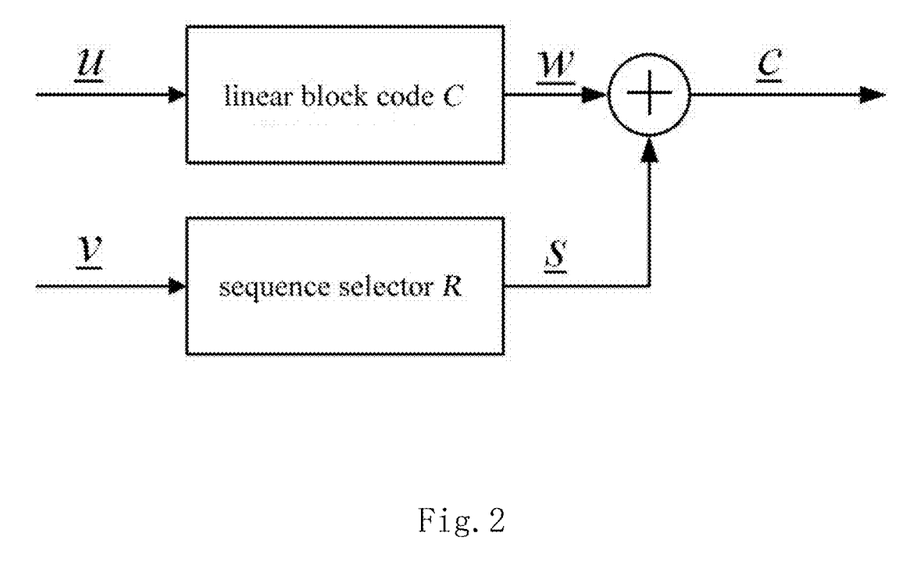
FIG. 2 is a coding block diagram of the present invention.

The solution of the present invention is further elaborated below in conjunction with specific applications:

The (3,6)-regular LDPC code constructed with PEG (progressive edge growth) method with a code length of 8064 and an information bit length of 4032 is used as the basic code, which is modulated by BPSK (binary phase-shift keying) and is transmitted in a AWGN (additive white Gaussian noise) channel. The length of the additional information sequence is set to m=5 and m=10 respectively. That is to say, each sequence with a code length of 8064 contains 4032 bits of payload information encoded by an LDPC code and additional information of 5 or 10 bits of random superposition code. When coding, as shown in FIG. 2, a binary matrix G with a size of m×n is constructed as a generator matrix by using a pseudo-random number generator as a coding matrix for sequence selection, and the superposition coding adopts bitwise modulo 2 operations. When decoding the additional information sequence, the characteristic metric function separately selects the decoding output of the additional information. When decoding the payload information sequence, the soft-decision sum product algorithm of the LDPC code is used, and the number of iterations is 50 times.

This embodiment is implemented by means of hard decision, specifically:

The characteristic metric function $f_C$ uses the following calculation method:

Calculate a hard decision sequence r from the received sequence y, obtain the sequence $\hat{w}^{(i)}$ by removing an interference of the sequence $s^{(i)}$ from r, then calculate the Hamming weight $W^{(i)}$ of the syndrome of the linear block code with respect to $\hat{w}^{(i)}$, and finally use $n-k-W^{(i)}$ as the output of the function $f_C$;

the hard decision sequence r is expressed as $r=(r_0, r_1, \ldots, r_{n-1})$, and each component in r is calculated according to the following method:

$$r_j = \begin{cases} 0, & P(y_j | c_j = 0) \ge P(y_j | c_j = 1) \\ 1, & P(y_j | c_j = 0) < P(y_j | c_j = 1) \end{cases}, 0 \le j \le n-1,$$

where:

$P(y_j|c_j)$ represents the channel transition probability with respect to input $c_j$ and output $y_j$;

remove the interference of the sequence $s^{(i)}$ from the hard decision sequence r to obtain the sequence $\hat{w}^{(i)}$, which means that each component in the $\hat{w}^{(i)} = (\hat{w}_0^{(i)}, \hat{w}_1^{(i)}, \ldots, \hat{w}_{n-1}^{(i)})$ is calculated as follows:

$$\hat{w}_j^{(i)} = r_j - s_j^{(i)}, \quad 0 \le j \le n-1$$

wherein the subtraction operation "−" is based on the finite group subtraction operation.

The method for calculating the Hamming weight $W^{(i)}$ of the syndrome of the linear block code is:

$$W^{(i)} = W_H(\hat{w}^{(i)} \cdot H^T),$$

where H is a check matrix of the linear block code C, $H^T$ is the transpose of the matrix H, the multiplication "·" is about the matrix multiplication in the binary domain, $W_H(\bullet)$ is the Hamming weight function, and output the number of non-zero elements in a sequence of arguments.

Figure 3:
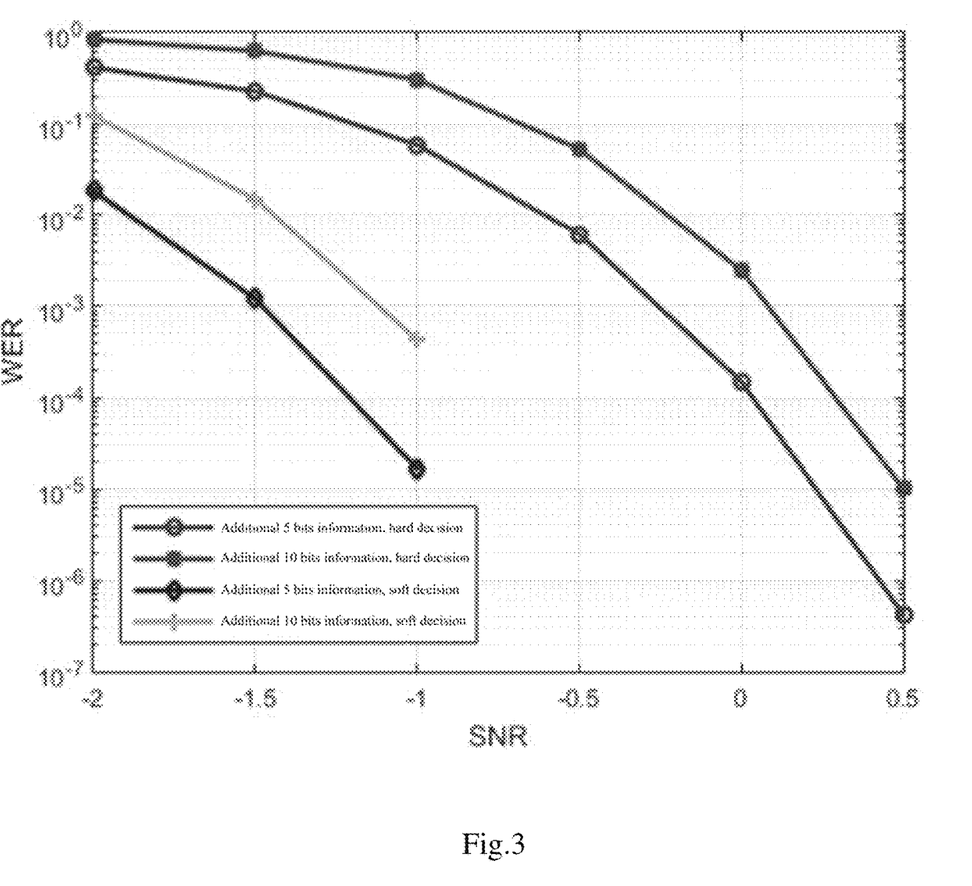
FIG. 3 is a performance diagram of frame error rate for decoding additional information sequences in an embodiment of the present invention.

As shown in FIG. 3, it can be seen that the length of the additional information sequence is m=5 and m=10, and the method for transmitting additional information using the binary LDPC code proposed by the present invention can reliably transmit the additional information sequence. According to statistics, for the adopted hard decision, when m=10, at SNR=0.5 dB, the frame error rate of the additional information sequence reaches $10^{-5}$, and at SNR=1 dB, the number of simulated frames reaches $5 \times 10^6$ without finding additional information sequence decoding error; when m=5, at SNR=0.5 dB, the additional information sequence frame error rate reached $4.2 \times 10^{-7}$, and at SNR=1 dB, the simulated frame number reached $2 \times 10^7$ without finding additional information sequence decoding error.

Figure 4:
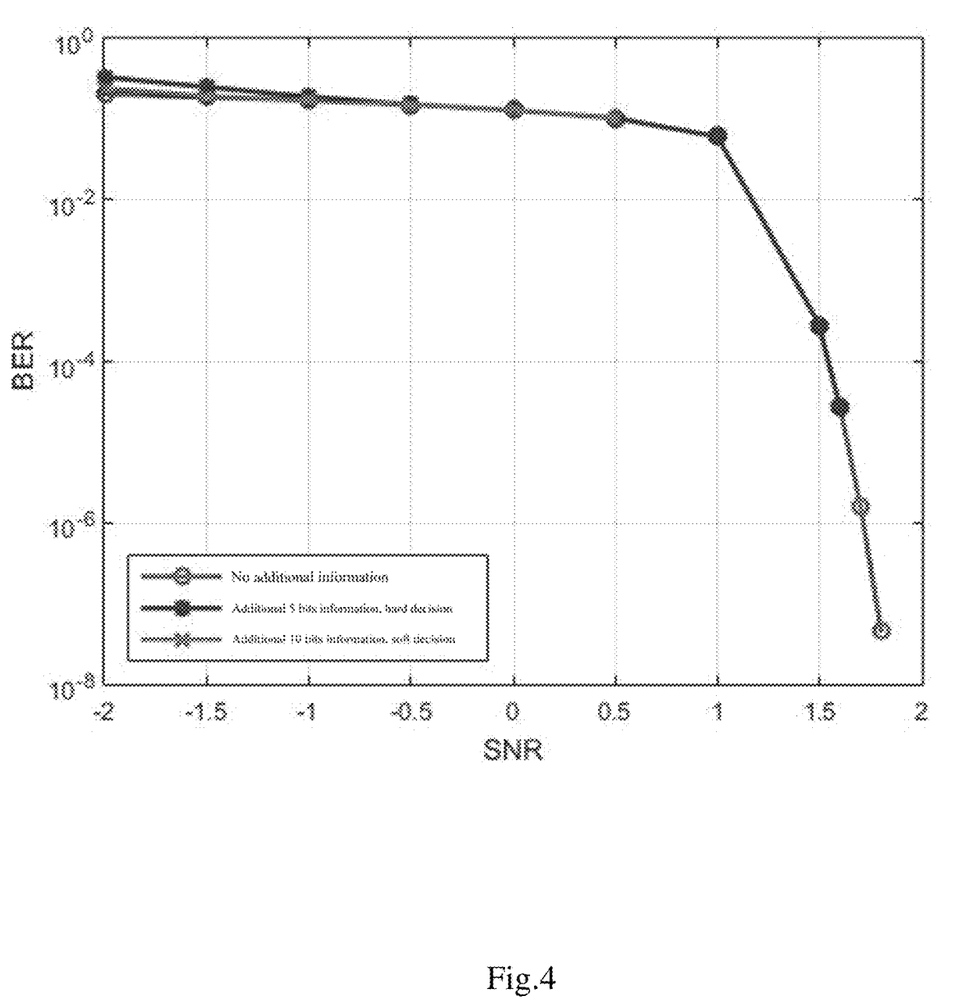
FIG. 4 is a performance diagram of bit error rate for decoding a payload information sequence in an embodiment of the present invention.

As shown in FIG. 4, it can be seen that when decoding by hard decision when the additional information sequence length is m=5, when the method for transmitting additional information using the binary LDPC code proposed by the present invention achieves the transmission of additional information at a higher signal-to-noise ratio, the transmission of additional information is negligible at the same time as the decoding of the payload information sequence. According to statistics, when the SNR is not less than 0dB, the decoding bit error rate curve of the basic LDPC code using the method proposed by the present invention basically coincides with the decoding bit error rate curve of the LDPC code when no additional information is transmitted.

Example 2

Except for the following technical features, other technical solutions of this Example 2 are the same as those of Example 1, that is, this Example 2 is implemented by means of soft decision, specifically:

The characteristic metric function $f_C$ comprises the following calculation method:
calculate a log-likelihood ratio LLR sequence z from the received sequence y, obtain a sequence $\hat{z}^{(i)}$ by removing the interference of the sequence $s^{(i)}$ from z, then calculate the likelihood function $\eta^{(i)}$ of $\hat{z}^{(i)}$ related to the linear block code, and finally use $\eta^{(i)}$ as the output of the function $f_C$;
the sequence z is represented as $z=(z_0, z_1, \ldots, z_{n-1})$, and each component in z is calculated as follows:

$$z_j = \log \frac{P(y_j \mid c_j = 0)}{P(y_j \mid c_j = 1)}, 0 \le j \le n-1;$$

remove the interference of the sequence $s^{(i)}$ from the sequence z to get the sequence $\hat{z}^{(i)}$, which means that each component in $\hat{z}^{(i)}=(\hat{z}_0^{(i)}, \hat{z}_1^{(i)}, \ldots, \hat{z}_{n-1}^{(i)})$ is calculated as follows:

$\hat{z}_j^{(i)} = z_j \times (-1)^{s_j^{(i)}}, 0 \le j \le n-1$.

The calculation of the likelihood function $\eta^{(i)}$ of the linear block code comprises the following methods:

$$\eta^{(i)} = 2 \sum_{p=0}^{m-1} \tanh^{-1}\left(\prod_{q \in H_p} \tanh\left(\frac{1}{2}\hat{z}_q^{(i)}\right)\right),$$

where m is the number of rows in the check matrix H of the linear block code C, and $H_p$ is the index set of the nonzero element in the p th row of H.

The calculation method of Example 2 (i.e., soft decision) has better performance of frame error rate than hard decision. The above examples are preferred embodiments of the present invention, but the embodiments of the present invention are not limited by the above examples. Any other changes, modifications, substitutions, combinations, simplifications, without departing from the spirit and principle of the present invention, should all be equivalent replacement methods, which are all included in the protection scope of the present invention. The examples set forth herein are provided to illustrate certain concepts of the disclosure.

Aspects of the present disclosure have been described above with reference to schematic flowchart diagrams and/or schematic block diagrams of methods, apparatus, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments.

The subject matter described herein may be formed by an apparatus controlled by hardware, software, firmware, or any combination thereof. As such, the terms module, encoder, decoder, and the like as used herein may refer to hardware, which may also include software and/or firmware components, for implementing the feature being described. In one example implementation, the subject matter described herein may be implemented using a computer readable or machine readable medium having stored thereon computer executable instructions that when executed by a computer (e.g., a processor) control the computer to perform the functionality described herein. Examples of machine readable media suitable for implementing the subject matter described herein include non-transitory computer-readable media, such as disk memory devices, chip memory devices, programmable logic devices, and application specific integrated circuits. In addition, a machine readable medium that implements the subject matter described herein may be located on a single device or computing platform or may be distributed across multiple devices or computing platforms.

The invention claimed is:

1. A method for transmitting additional information using linear block codes, comprising:
   (1) transmitting payload information and the additional information, wherein the payload information comprises a linear block code C with a code length of n and an information bit length of k as a payload code, further comprising a step of superposition coding an additional information sequence $v=(v_0, v_1, \ldots, v_{m-1})$ of length m into a transmission codeword $c=(c_0, c_1, \ldots, c_{n-1})$ of length n by performing:

(1.1) encoding a payload information sequence u of length k into a linear block code word $w=(w_0, w_1, \ldots, w_{n-1})=C(u)$;

(1.2) inputting the additional information sequence v of length m into a sequence selector R and outputting a sequence $s=(s_0, s_1, \ldots, s_{n-1})=R(v)$ of length n; and (1.3) superimposing the sequence s with the linear block code word w to obtain the transmission codeword c;

(2) receiving the payload information and the additional information v, further comprising a step of decoding the additional information by performing:

for each possible input additional information sequence $v^{(i)}$, ($0 \le i \le 2^m-1$), i=0, 1, 2 . . . , calculating a corresponding superposition sequence $s^{(i)}=R(v^{(i)})=(s_0^{(i)}, s_1^{(i)}, \ldots, s_{n-1}^{(i)})$;

according to a characteristic metric function $\mu^{(i)}=f_C(y, s^{(i)})$ related to the linear block code C, selecting an additional information sequence $\hat{v}$ as an output, wherein $\hat{v}=(\hat{v}_0, \hat{v}_1, \ldots, \hat{v}_{m-1})$ such that:

$$\hat{v} = \arg\max_{v} f_C(y, R(v));$$

and (3) decoding the payload information sequence by performing:

removing an interference of superposition sequence $\hat{s}=(\hat{s}_0, \hat{s}_1, \ldots, \hat{s}_{n-1})=R(\hat{v})$ from a received sequence y, and obtaining a corresponding received sequence $\tilde{y}$ of the linear block code related to the payload information;

decoding $\tilde{y}$ using a decoder of the linear block code C and outputting a decoded output $\hat{u}$ of the payload information sequence.

2. The method for transmitting additional information using linear block codes according to claim 1, characterized in that in the step (1), the linear block code C with a code length of n and an information bit length of k is an arbitrary type of linear block code encoder;

in the step (1.2), the sequence selector R refers to an arbitrary type of encoder whose input information length is m and output length is n; and in the step (1.3), the superposition coding refers to outputting j th components $c_j=s_j \oplus w_j$ of the transmission codeword c of length n, where $s_j$ and $w_j$ are the j th component of s and w respectively, $0 \le j \le n-1$, j=0, 1, 2 . . . , and an addition operation "$\oplus$" follows a finite group addition.

3. The method for transmitting additional information using a linear block code according to claim 1, characterized in that the characteristic metric function $\mu^{(i)}=f_C(y, s^{(i)})$ is a real-value function related to the linear block code C with input of a received sequence y and a sequence $s^{(i)}$, and represents a likelihood measure of the received sequence $\tilde{y}$ related to a coset $s^{(i)} \oplus C$.

4. The method for transmitting additional information using a linear block code according to claim 1, characterized in that the characteristic metric function $f_C$ performs:

calculating a hard decision sequence r from the received sequence y, obtaining the sequence $\hat{w}^{(i)}$ by removing an interference of the sequence $s^{(i)}$ from r, then calculating a Hamming weight $W^{(i)}$ of a syndrome of the linear block code C with respect to $\hat{w}^{(i)}$, and finally using $n-k-W^{(i)}$ as the output of the characteristic metric function $f_C$, wherein the hard decision sequence r is expressed as $r=(r_0, r_1, \ldots, r_{n-1})$, and each component in r is calculated according to the following method:

$$r_j = \begin{cases} 0, & P(y_j | c_j = 0) \ge P(y_j | c_j = 1) \\ 1, & P(y_j | c_j = 0) < P(y_j | c_j = 1) \end{cases}, 0 \le j \le n-1,$$

$$j = 0, 1, 2 \ldots,$$

where:

$P(y_j|c_j)$ represents a channel transition probability with respect to input $c_j$ and output $y_j$; and removing the interference of the sequence $s^{(i)}$ from the hard decision sequence r to obtain the sequence $\hat{w}^{(i)}$, wherein $\hat{w}^{(i)}$ means that each component in $\hat{w}^{(i)}=(\hat{w}_0^{(i)}, \hat{w}_1^{(i)}, \ldots, \hat{w}_{n-1}^{(i)})$ is calculated as follows:

$$\hat{w}_j^{(i)} = r_j - s_j^{(i)}, 0 \le j \le n-1, j=0,1,2 \ldots$$

wherein a subtraction operation "−" is based on a finite group subtraction operation.

5. The method for transmitting additional information using a linear block code according to claim 4, characterized in that the method for calculating the Hamming weight $W^{(i)}$ of the syndrome of the linear block code C is:

$$W^{(i)} = W_H(\hat{w}^{(i)} \cdot H^T),$$

wherein H is a check matrix of the linear block code C, $H^T$ is a transpose of the check matrix H, a multiplication symbol "·" refers to a matrix multiplication in a binary domain, $W_H(\bullet)$ is a Hamming weight function, and a number of non-zero elements in a sequence of arguments is outputted.

6. The method for transmitting additional information using a linear block code according to claim 1, characterized in that the characteristic metric function $f_C$ performs:

calculating a log-likelihood ratio sequence z from the received sequence y, obtaining a sequence $\hat{z}^{(i)}$ by removing the interference of the sequence $s^{(i)}$ from z, then calculating a likelihood function $\eta^{(i)}$ of $\hat{z}^{(i)}$ related to the linear block code C, and using $\eta^{(i)}$ as an output of the characteristic metric function $f_C$;

wherein the sequence z is represented as $z=(z_0, z_1, \ldots, z_{n-1})$, and each component in z is calculated as follows:

$$z_j = \log \frac{P(y_j | c_j = 0)}{P(y_j | c_j = 1)}, 0 \le j \le n-1, j = 0, 1, 2 \ldots;$$

wherein removing the interference of the sequence $s^{(i)}$ from the sequence z to get the sequence $\hat{z}^{(i)}$ means that each component in $\hat{z}^{(i)}=(\hat{z}_0^{(i)}, \hat{z}_1^{(i)}, \ldots, \hat{z}_{n-1}^{(i)})$ is calculated as follows:

$$\hat{z}_j^{(i)} = z_j \times (-1)^{s_j^{(i)}}, 0 \le j \le n-1, j=0,1,2 \ldots.$$

7. The method for transmitting additional information using a linear block code according to claim 6, characterized in that the calculation of the likelihood function $\eta^{(i)}$ of the linear block code C comprises:

$$\eta^{(i)} = 2\sum_{p=0}^{m-1} \tanh^{-1}\left(\prod_{q\in H_p} \tanh\left(\frac{1}{2}\hat{z}_q^{(i)}\right)\right),$$

where m is the number of rows in the check matrix H of the linear block code C, and $H_p$ is an index set of the nonzero element in the p th row of H.

8. The method for transmitting additional information using a linear block code according to claim 6, characterized in that the calculation of the likelihood function $\eta^{(i)}$ of the linear block code C comprises the following methods: input $\hat{z}^{(i)}$ to a decoder D of the linear block code C, output a decoding sequence as $\hat{c}^{(i)}=(\hat{c}_0^{(i)}, \hat{c}_1^{(i)}, \ldots, \hat{c}_{n-1}^{(i)})$, and then calculate $s^{(i)}\oplus\hat{c}^{(i)}$ as a log-likelihood function of a transmission sequence:

$$\eta^{(i)} = \sum_{j=0}^{n-1} \log P(y_j \mid s_j^{(i)} \oplus \hat{c}_j^{(i)}),$$

wherein the linear block code C of the decoder D is an arbitrary type of soft input decoder.

9. The method for transmitting additional information using a linear block code according to claim 1, characterized in that in the step (3), the interference of the superposition coding $\hat{s}=R(\hat{v})$ is removed from the received sequence y, and the corresponding received sequence $\tilde{y}$ of the linear block code C related to the payload information is obtained by calculating soft information $\tilde{y}_j$ of j th components $\tilde{y}_j$ of $\tilde{y}$ with:

$$P(\tilde{y}_j \mid w_j) = P(y_j \mid c_j = w_j \oplus \hat{s}_j),$$

where $\hat{s}_j$ is the j th component of $\hat{s}$, where $0 \leq j \leq n-1$, $j=0, 1, 2 \ldots$.

10. The method for transmitting additional information using a linear block code according to claim 1, characterized in that the decoder of the linear block code C is to an arbitrary type of linear block code decoder.

11. A method for receiving a transmission and decoding additional information of the transmission, comprising:

(1) receiving the transmission, wherein an additional information of the transmission has been superposition coded, wherein using a linear block code C with a code length of n and an information bit length of k as a payload code, the additional information sequence $v=(v_0, v_1, \ldots, v_{m-1})$ of length m has been superposition coded into a transmission codeword $c=(c_0, c_1, \ldots, c_{n-1})$ of length n by performing:
  (1.1) encoding a payload information sequence u of length k into a linear block code word $w=(w_0, w_1, \ldots, w_{n-1})=C(u)$;
  (1.2) inputting an additional information sequence v of length m into a sequence selector R and outputting a sequence $s=(s_0, s_1, \ldots, s_{n-1})=R(v)$ of length n; and
  (1.3) superimposing the sequence s with the linear block code word w to obtain the transmission codeword c;
(2) decoding the additional information sequence by performing:
  for each possible input additional information sequence $v^{(i)}$, ($0 \leq i \leq 2^m - 1$), $i=0, 1, 2 \ldots$, calculating a corresponding superposition sequence $s^{(i)}=R(v^{(i)})=(s_0^{(i)}, s_1^{(i)}, \ldots, s_{n-1}^{(i)})$;
  according to a characteristic metric function $\mu^{(i)}=f_C(y, s^{(i)})$ related to the linear block code C, selecting an additional information sequence $\hat{v}$ as an output, wherein $\hat{v}=(\hat{v}_0, \hat{v}_1, \ldots, \hat{v}_{m-1})$ such that:

$$\hat{v} = \operatorname*{argmax}_{v} f_C(y, R(v));$$

and
(3) decoding the payload information sequence u by performing:
  removing an interference of superposition sequence $\hat{s}=(\hat{s}_0, \hat{s}_1, \ldots, \hat{s}_{n-1})=R(\hat{v})$ from a received sequence y, and obtaining a corresponding received sequence $\tilde{y}$ of the linear block code related to the payload information;
  decoding $\tilde{y}$ using a decoder of the linear block code C and outputting a decoded output $\hat{u}$ of the information sequence u.

\* \* \* \* \*